United States Patent [19]
Cote et al.

[11] Patent Number: 4,940,156
[45] Date of Patent: Jul. 10, 1990

[54] THERMOPLASTIC MULTI-PURPOSE TRAY WITH VARIABLE COMPARTMENTS

[75] Inventors: James H. Cote; Jurgen Ekberg, both of Export; Bruce T. Cleevely; Harry M. George, both of Pittsburgh, all of Pa.

[73] Assignee: National Semiconductor Corporation, Santa Clara, Calif.

[21] Appl. No.: 383,102

[22] Filed: Jul. 13, 1989

[51] Int. Cl.⁵ ................ B65D 73/02; B65D 25/06; B65D 6/18
[52] U.S. Cl. ................ 220/22.3; 206/334; 206/509; 220/6
[58] Field of Search .......... 220/22, 22.1, 22.2, 220/22.3, 6, 7; 206/334, 509, 511, 512

[56] References Cited
U.S. PATENT DOCUMENTS

| | | |
|---|---|---|
| 3,544,032 | 12/1970 | Wilson et al. |
| 3,655,114 | 4/1972 | Turner ............................ 220/7 |
| 3,904,066 | 9/1975 | Wilson . |
| 4,151,948 | 5/1979 | de la Fuente . |
| 4,171,740 | 10/1979 | Clement et al. |
| 4,248,349 | 2/1981 | Locke et al. |
| 4,427,114 | 1/1984 | Howell ........................ 206/334 |
| 4,446,982 | 5/1984 | Corse ......................... 220/22.3 |
| 4,763,781 | 8/1988 | Donalson ..................... 206/334 |
| 4,763,782 | 8/1988 | Sinchok ....................... 220/22.2 |
| 4,798,305 | 1/1989 | Laverty . |
| 4,856,671 | 8/1989 | Reppel ........................ 220/22.3 |
| 4,887,874 | 12/1989 | Joffe ............................... 220/7 |

*Primary Examiner*—George E. Lowrance
*Attorney, Agent, or Firm*—Parmelee, Miller, Welsh & Kratz

[57] ABSTRACT

An injection molded, thermoplastic tray for storage and shipment of leadframes comprises a receptacle in the form of a rectangular base, and a plurality of dividers engageable with the base. The receptacle has first and second hinged side walls with outwardly extending flanges. The dividers have a first engaging member which engages with the first side wall to hold the same in an upward position and a second engaging member which is engageable with the second side wall when the second side wall is pivoted to an upward position to hold the same in the upward position. Notches are provided in the bore of the receptacle which are engaged with downwardly and outwardly hooks on the bottom of the divider. Stacking members in the form of upwardly extending saddles and outwardly extending pegs provide for stacking of one tray atop another.

14 Claims, 3 Drawing Sheets

THERMOPLASTIC MULTI-PURPOSE TRAY WITH VARIABLE COMPARTMENTS

BACKGROUND OF THE INVENTION

The present invention relates to a thermoplastic injection molded tray which can be used for storage, shipping or treatment of components contained therein and has variable sized compartments. More specifically, the tray is designed for use in the storage, shipping and degreasing, or other treatment, of leadframes for use in integrated circuit production.

Leadframes can be formed from metallic strips by stamping and plating and are then transported to commercial users for incorporation as integrated circuits into a myriad of electrical components. After intitial formation of the leadframe, the same must be transported to commercial users in tray-like receptacles for use with or without further treatment, such as a degreasing step. Because of the numerous sizes of such leadframes, it is desirable to provide a receptacle that has variable compartment sizes so that such trays can be formed from common basic components.

A useful adjustable shipping tray is described in U.S. Pat. No. 4,793,305, for use in transportation and storage of leadframes, which tray is molded preferably from expanded polystyrene. The tray described therein has movable partitions that are pressed into place for use with different sizes or quantities of material, such as leadframes, and the description refers to the problems involved with shipment of leadframes. The partitions have a pattern of alternating vertical grooves and projecting teeth that interlock with interior faces of the vertical walls of the tray. Such a construction has a limitation, however, in that the components to be placed into the tray must always be vertically transferred onto the tray bottom, whereas in the formation of certain leadframes, such as U-shaped or ceramic dual in-line leadframes, it is desirable to be able to slide or laterally transfer the leadframes onto the bottom of a tray, while also providing for restraining the leadframes in compartments of a tray after such placement.

It is an object of the present invention to provide an injection molded tray which is useful in the storage, transportation, and also treatment of leadframes therein, with the ability to laterally transfer such leadframes onto the base of the tray.

It is another object of the present invention to provide an injection molded tray of two basic units, a receptacle and a plurality of dividers, which are adjustable to accept various sizes of components.

SUMMARY OF THE INVENTION

An injection molded, thermoplastic tray is formed from a receptacle that has a rectangular base and a plurality of divider. The receptable has first side walls connected to the receptacle across an integral hinge and an opposed second side wall also hinged thereto. The side walls terminate as flanges. The dividers each have a first engaging member at one end that engages with the first side wall and a second engaging member that is engagable with the second side wall. With at least one divider extending across the receptacle, after the first engaging member is secured to the first side wall, the second side wall is pivoted about the hinge to an upright position and engages with the second engaging member of the divider to hold the side wall in upright position.

The first engaging member is preferably an outwardly and downwardly extending hook-like projection flush with the top surface of the divider and engages with the first side wall through a slot in the first side wall and flange, while the second engaging member is preferably an outwardly and downwardly extending hook-like projection spaced from the top surface of the divider and engages with the second side wall through a slot in the side wall spaced from the flanged portion thereof. Notches are provided in the base of the receptacles and downwardly and outwardly extending hook-like projections are provided on the dividers which engage with the base through the notches. Support ribs are provided on the underside of the rectangular base to reinforce the base and to provide clearance between projections extending through the notches and an underlying supporting surface. The dividers are preferably T-shaped with a verrtical section and a horizontal section along the top thereof.

Stacking of the thermoplastic trays is provided by upwardly extending saddles on the first and second side walls, with pegs extending from the side walls, such that pegs of an overlying tray mate with the saddles of an underlying tray.

The present structure enables lateral placement of components into a tray with the second side wall in a released position and the second side wall is then pivoted upwardly and secured in position when the tray has been filled to the desired degree.

DESCRIPTION OF THE DRAWINGS

The invention will become more readily apparent from the following description of a preferred embodiment thereof shown, by way of example only, in the accompanying drawings, wherein.

DETAILED DESCRIPTION

The present thermoplastic tray 1 for storage and/or shipment of leadframes is comprised of two molded thermoplastic units, a receptacle comprising a rectangular base with side walls, and a plurality of dividers that are engageable with the base.

Figure 1:
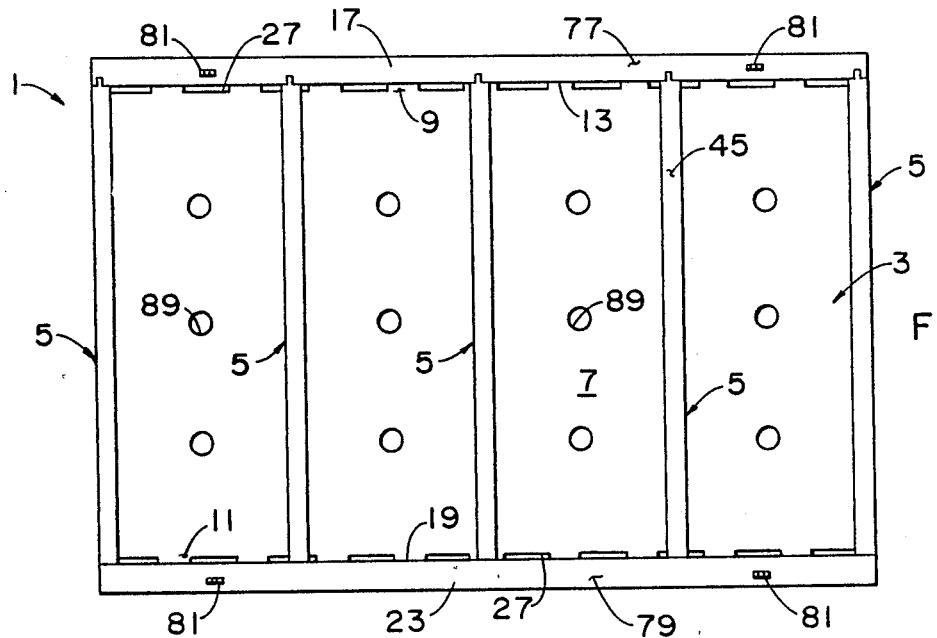
FIG. 1 is a plan view of a thermoplastic tray produced in accordance with the present invention.

An assembled thermoplastic molded tray 1 is illustrated in FIG. 1, wherein a receptacle 3 and dividers 5 are shown. The receptacle 3 comprises a rectangular base 7 and has a first side 9 and opposed second side 11. A first side wall 13 is integrally molded with the first side 9 of the rectangular base 7, across a first hinge line 15, and terminates as flanged portion 17 which extends perpendicularly to the first side wall 13. A second side wall 19 is integrally molded with the second side 11 of the rectangular base 7, across a second hinge line 21, and also terminates as a flanged portion 23 which extends perpendicularly to the second side wall 19.

Figure 2:
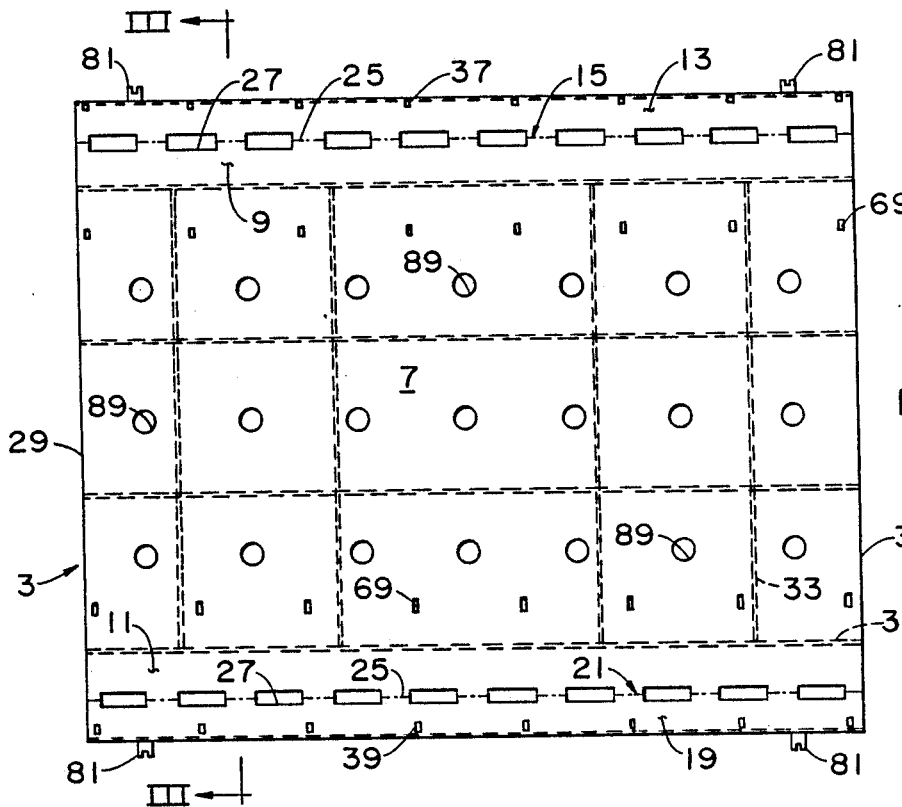
FIG. 2 is a plan view of the receptacle unit of the tray of the present invention in an as-molded position.
Figure 3:
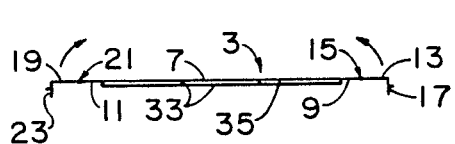
FIG. 3 is a cross-sectional view taken along the lines III—III of FIG. 2.
Figure 4:
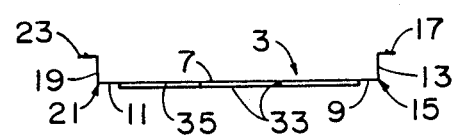
FIG. 4 is a view similar to FIG. 3 following pivoting of the side walls of the receptacle to an upright position.

The receptacle 3 is illustrated in FIGS. 2 and 3 in the ass-molded condition, following injection molding thereof, with the rectangular base 7 and first and second side walls 13 and 19 in a common plane therewith, and with the flanged portions 17 and 23 of the first and second side walls 13 and 19, respectively, extending in a common direction, perpendicularly thereto. Following said molding, the first and second side walls 13 and 19 are pivoted in the direction of the arrows shown in FIG. 3, to form a U-shaped receptacle with outwardly extending flanged portions 17 and 23, as shown in FIG. 4. In order to assist in the pivoting of the first and second side walls 13 and 19, the first and second hinge lines 15 and 21 are formed as with a score line 25 and, preferably, with spaced apertures 27 formed along the hinge lines to provide more ready pivoting of the first and second side walls 13 and 19 relative to the rectangular base 7. Opposed ends 29 and 31 of the receptacle 3 are generally at right angles to the first and second sides 9 and 11 of the rectangular base 3, while support ribs 33 are provided on the bottom surface 35 of the rectangular base 7.

Figure 5:
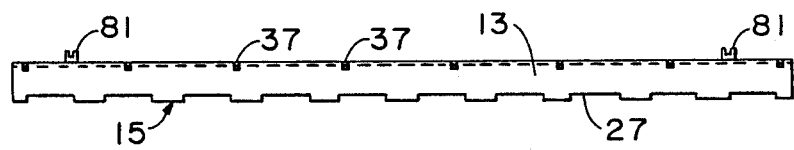
FIG. 5 is an as-molded view of the first side wall of the receptacle.
Figure 6:
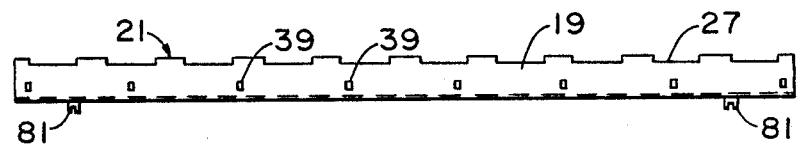
FIG. 6 is an as-molded view of the second side wall of the receptacle.

As best illustrated in FIG. 5, the first side wall 13 and the flanged portion 17 thereof have cooperating slots 37 therein while, as illustrated in FIG. 6, the second side wall 19 has slots 39 therein, spaced from the flanged portion 23 thereof, with opposed slots 37 and 39 being in a common vertical plane relative to the rectangular base 7, the purpose of which is to provide securement for dividers 5 as hereinafter described.

Figure 7:
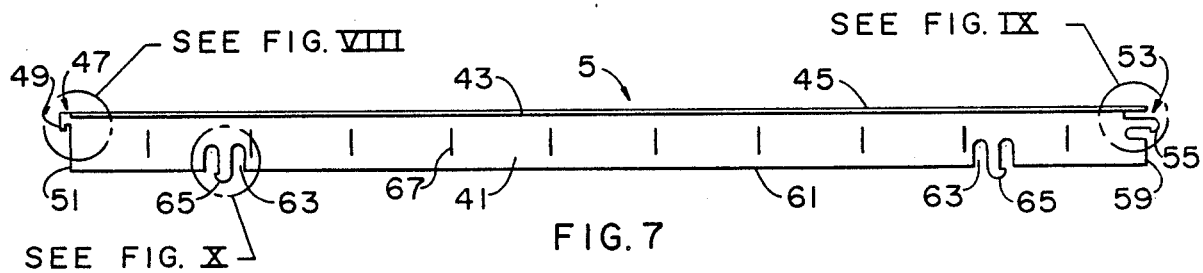
FIG. 7 is an elevational view of a divider unit of the tray of the present invention.
Figure 8:
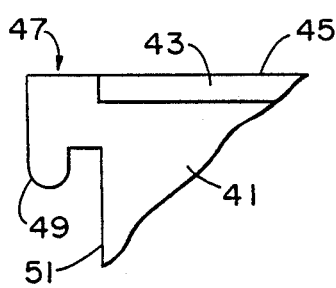
FIG. 8 is an enlarged view of the portion of the first engaging means of the dividers in the circle labeled VIII in FIG. 7.
Figure 9:
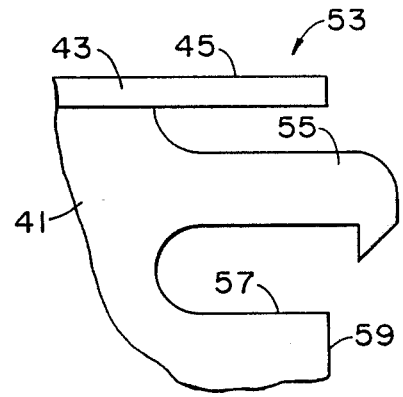
FIG. 9 is an enlarged view of the portion of the second engaging means of the divider in the circle labeled IX in FIG. 7.
Figure 10:
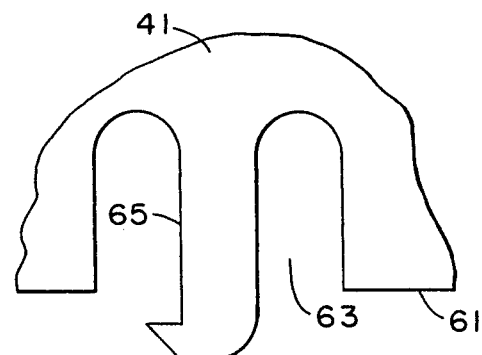
FIG. 10 is an enlarged view of the portion of the divider in the circle labeled X in FIG. 7.

A divider 5 is illustrated in FIG. 7 and is formed as an elongated thermoplastic member preferably comprising a vertical section 41 with a pari of horizontal sections 43, extending from the top surface 45 thereof, which extend outwardly on both sides of the vertical section 41 in a T-shaped configuration, the horizontal sections 43 being flushed with the top surface 45 of the vertical section 41. The divider 5 has a first engaging member 47 comprised of an outwardly and downwardly extending hook-like projection 49 on a first end 51 of the divider 5, the hook-like porjection extending outwardly from the horizontal sections 43 thereof and dowwardly from the top surface 45 thereof, as best shown in FIG. 8. A second engaging member 53 (FIG. 9) is provided on the divider 5 comprised of an outwardly and downwardly extending hook-like projection 55, which is vertically spaced from the top surface 45 and horizontal sections 43 of the divider 5, with the hook-like projection 55 preferably extending outwardly from a hollow 57 in the second end 59 thereof. The bottom surface 61 of divider 5 has at least one cavity 63 formed therein, and preferably two such spaced cavities, with a downwardly and outwardly hook-like porjection 65 extending therefrom, beyond the bottom surface 61, in the direction of the adjacent end of the divider 5, as shown in FIG. 10. Preferably, as shown in FIG. 7, two such downwardly and outwardly extending hook-like projections 65 are provided, one extending outwardly towards the first end 51 of the divider 5 and the othr extending outwardly towards the second end 59 of the divider 5. Vertical reinforcing ribs 67 are provided on the veritcal section 41 of the divider 5 to provide reinforcement and stability thereto.

A plurality of notches 69 are provided in the rectangular base 7, as shown in FIG. 2, which notches 69 are in a vertical plane common to a slot 37 in the first side wall 13 and flanged portion 17 and also with a slot 39 in the second side wall 19, which notches are adapted to communicate with the downwardly and outwardly hook-like projections 65 on a divider to vertically secure a divider 5 to the rectangular base 7.

Figure 11:
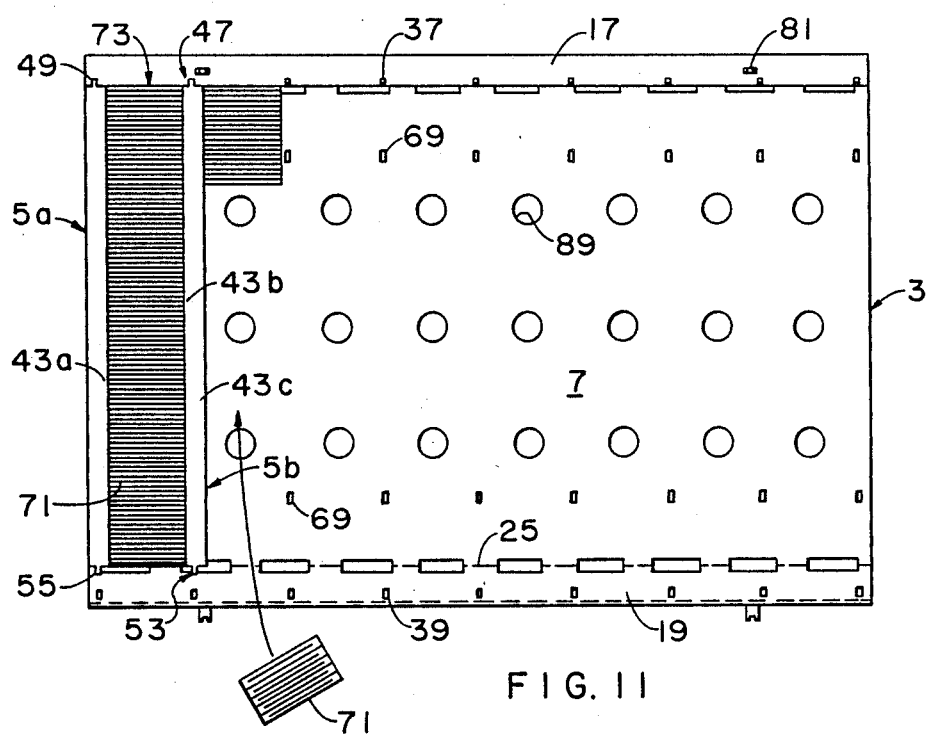
FIG. 11 illustrates a partially filled tray of the present invention showing the lateral placement of leadframes into the tray and retention of a first row of the leadframes.

The dividers 5 are preferably sequentially engaged with the receptacle 3, as illustrated in FIG. 11. In such engagement, the receptacle 3 is formed by injection molding in the position shown in FIGS. 2 and 3 and the first side wall 13 pivoted in an upward postion as shown in FIG. 4, by pivoting along the first hinge line 15, such that the flanged portion 17 thereof extends outwardly from the rectangular base 7. A first engaging member 47 of a partition 5, illustrated as 5a in FIG. 11, is then engaged in a slot 37, in the first side wall 13 and flanged portion 17, with the hook 49 thereof extending through the slot 37 so as to maintain the first side wall 13 in the pivoted upright position, with the divider 5a serving as an end wall for the receptacle 3. The downwardly and outwardly hook-like porjections 65 on the divider 5a are then inserted through respectively situated notches 69 such that the divider 5a, in addition to holding the first side wall in upward position, is engaged with the rectangular base 7 so as to be secured in a vertical relationship. At this stage, the second side wall 19 remains in a co-planar relationship with the rectangular base 7 so as to enable lateral placement of components, such as leadframes 71, illustrated as U-shaped leadframes over the second side wall 19 and onto the rectangular base 7. After placement of a first row 73, a second divider, illustrated as divider 5b is engaged, with the hook 49 of first engagement means 47 engaged in a further slot 37 in first side wall 13 and flanged portion 17, and the downwardly and outwardly extending hook-like projection 65 thereof engaged in communicating notches 69 in the rectangular base 7. The leadframes 71, as illustrated in row 73, in addition to being retained horizontally by dividers 5a and 5b are also held against vertical movement by overlapping horizontal sections 43, shown as 43a and 43b of the dividers 5a and 5b. A second row 75 of leadframes 71, shown partially placed on the rectangular base 7, are then laterally moved over second side wall 19 and onto the rectangular base 7, as illustrated in FIG. 11. The procedure used with divider 5b is then repeated when the row 75 is complete and the sequence repeated until the thermoplastic tray 1 is filled to the extend desired. After desired filling of the thermoplastic tray, the second side wall 19 is pivoted upwardly such that the second engaging members 53 pass through the slots 39 in the second side wall 19, with the outwardly and downwardly extending hooks 55 engaging with the second side wall 19 to hold the same in upright position. This provides a rectangular base 7 surrounded by spaced engaged dividers 5 and first and second engaged side walls 13 and 19. The assembled tray 1 is illustrated in FIG. 1, with the rows of leadframes removed for clarity, and shows five dividers 5 extending across the rectangular base 7, with the first side wall 13 retained in upward position and the flanged portion 17 thereof extending outwardly therefrom and with the second side wall 19 retained in upward position and the flanged portion 23 thereof extending outwardly therefrom. As shown, the top surface 45 of the divider 5 is flush with the top surface 77 of the flanged portion 17 of the first side wall 13 and also flush with the top surface 79 of the flanged portion 23 of the second side wall 19.

Figure 12:
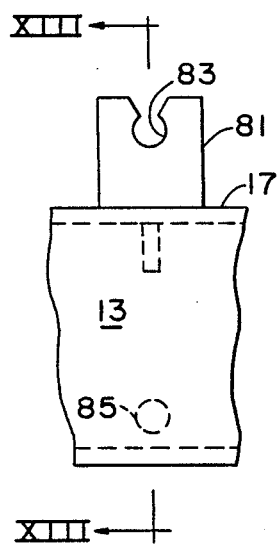
FIG. 12 is a side elevational view of the saddle of the stacking feature of the tray of the present invention.
Figure 13:
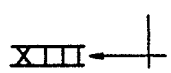
FIG. 13 is a view taken along lines XIII—XIII of FIG. 12.
Figure 13:
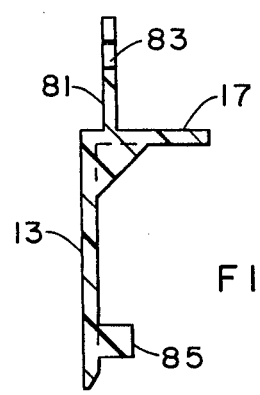
Figure 14:
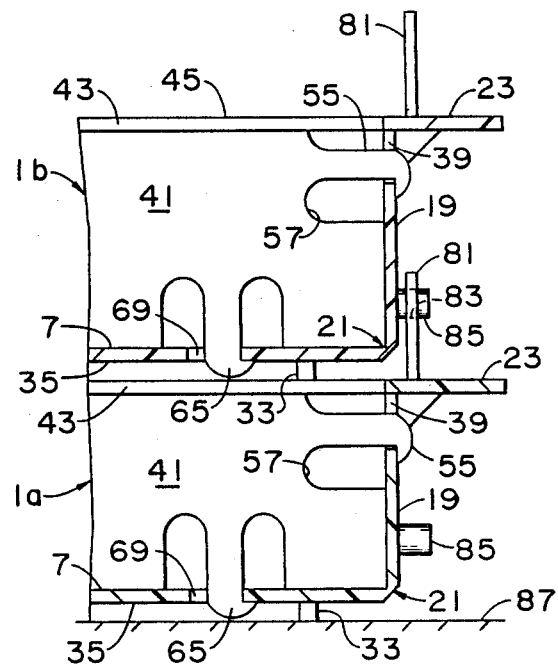
FIG. 14 is a cross-sectional view of two trays of the present invention in stacked position.

In order to provide for stacking of trays 1 one atop another, at least two upwardly extending saddles 81 (FIG. 12) are provided on the flanged portion 17 of first side wall 13, and at least two upwardly extending saddles 81 are also provided on the flanged portion 23 of second side wall 19, the saddles 81 having a groove 83 therein. The saddles 81 are positioned on the flanged portions 17 and 23 at a location spaced from the side walls 13 and 19 respectively. The side walls 13 and 19 have, extending outwardly therefrom, pegs 85 which are adapted to mate with the grooves 83 in the saddles 81, as illustrated in FIGS. 12 and 13 relative to the first side wall 13. FIG. 14 illustrates stacking of two thermoplastic trays 1a and 1b, as viewed at the second side wall 19. The second tray 1b, when superimposed on first tray 1a is oriented such that pegs 85 mate with saddles 81 in the grooves 83. With use of the support ribs 33 on the bottom surface 35 of the rectangular base 7, the lowermost first tray 1a can rest on a supporting surface 87 with the bottom surface 35 spaced from the supporting surface 87 a distance sufficient to prevent contact of the downwardly and outwardly extending hook-like projections 65, which are engaged in notches 69 in the rectangular base 7, with the supporting surface, which could possibly dislodge the engagement therewith. The uppermost or second tray 1b, when pegs 85 are mated with saddles 81, is positioned such that the support ribs 33 on bottom surface 35 of the rectangular base provide spacing between that bottom surface and the top surface 45 of a subadjacent divider 5 to also provide for prevention of contact of the downwardly and outwardly extending hook-like projections 65 of a divider 5 with the top surface 45 of a divider 5 of the lowermost first tray 1a.

The present tray 1, in addition to being useful for storage and shipping of leadframes is also adapted for use in certain treatment of the leadframes while contained in the tray. For example, before end use of the leadframes, it may be desirable to degrease the same by wahsing with a degreasing fluid. For this purpose, the rectangular base 7 of the tray 1 preferably has formed therein a plurality of drainholes 89.

The present thermoplastic tray, as previously described, is formed from injection molded parts and is of a thermoplastic material that will provide the desired pivoting along the hinge lines 15 and 21 and may also be a material that is resistant to the environment to which the trays may be subject during treatment of the contents. For example, when degreasing is proposed, an especially useful thermoplastic material is polypropylene which will provide the necessary hinge properties while being chemically resistant to general degreasing solutions.

What is claimed is:

1. A thermoplastic tray for the storage and transportation of leadframes, comprising:
   a receptacle comprising a rectangular base having opposed first and second sides; a first side wall on said rectangular base, terminating in a flanged portion extending perpendicularly thereto, integrally molded to a first side of said base across a first hinge line; and a second side wall on said rectangular base, terminating in a flanged portion extending perpendicularly thereto, integrally molded to an opposed second side of said base across a second hinge line; and
   a plurality of elongated dividers, each divider having a first engaging member at one end engageable with said first side wall and a second engaging member at the other end engageable with said second side wall; such that when at least one elongated divider extends across said base, with the first engaging member engaged with said first side wall to hold the same in upright position, said second side wall is pivotal to an upright position and engages the second engaging member to hold the second side wall in upright position.

2. A thermoplastic tray for the storage and transportation of leadframes as defined in claim 1 wherein the first side wall and flange have cooperating slots therein and the first engaging member of the divider comprises an outwardly and downwardly extending hook-like projection flush with the top surface of the divider so as to engage in said cooperatng slots.

3. A thermoplastic tray for the storage and transportation of leadframes as defined in claim 2 wherein the second side wall has slots therein, spaced from the flanged portion thereof, in a verticaly plane common to the slots of said first side wall and the second engaging member comprises an outwardly and downwardly extending hook-like projection spaced from the top surface of the divider.

4. A thermoplastic tray for the storage and transportation of leadframes as defined in claim 3 wherein at least one notch is provided in said rectangular base in a vertical plane common to the slots in said first and second side walls, and downwardly and outwardly extending hook-like porjections are provided on said divider which extend through and engage with said base through said notch.

5. A thermoplastic tray for the storage and transportation of leadframes as defined in claim 4 wherein support ribs are provided on the underside of said rectangular base, which ribs are of a size sufficient to space the hook-like projection extending through the notch of said rectangular base from a supporting surface for the tray.

6. A thermoplastic tray for the storage and transportation of leadframes as defined in claim 3 wherein said divider comprises a vertical section and a horizontal section along the top of said vertical section extending outwardly on both sides thereof, the horizontal section having a top surface which is flush with the top surface of the flanges of said first and second side walls when engaged therewith.

7. A thermoplastic tray for the storage and transportation of leadframes as defined in claim 6 wherein the flanged portion of said first side wall has at least two upwardly extending saddles thereon, the flanged portion of said second wall has at least two upwardly extending saddles thereon, and said first and second side walls have pegs extending outwardly therefrom positioned thereon so as to mate with said upwardly extending saddles to enable stacking of a said tray atop another said tray.

8. A thermoplastic tray for the storage and transportation of leadframes as defined in claim 1 wherein a plurality of drainholes are formed in said rectangular base to permit drainage of fluid therethrough.

9. A thermoplastic tray for the storage and transportation of leadframes as defined in claim 1 wherein spaced apertures are formed along at least one of said first and second hinge lines to provide more ready pivoting of said side wall relative to said rectangular base.

10. A thermoplastic tray for the storage and transportation of leadframes, comprising:
a receptacle comprising a rectangular base having opposed first and second sides; a first side wall on said rectangular base, terminating in a flanged portion extending perpendicularly thereto, integrally molded to the first side of said base across a first hinge line, said first side wall and flange having cooperating slots therein; a second side wall on said rectangular base, terminating in a flanged portion extending perpendicularly thereto, integrally molded to the second side of said base across a second hinge line, said second side wall having slots therein, spaced from the flanged portion thereof, with said slots of said second side wall being in a vertical plane common to the slots of said first side wall;
and a plurality of elongated dividers, each divider having on a first end an outwardly and downwardly extending hook-like projection, flush with the top surface of the divider, engageable with said first side wall, and on a second end an outwardly and downwardly extending hook-like porjection spaced from the top surface of the divider; such that when at least one elongated divider extends across said base, with the hook-like projections at the first end engaged with said first side wall to hold the same in upright position, said second sidewall is pivotal to an upright position and engages the hook-like projections at the second end to hold the second side wall in upright position.

11. A thermoplastic tray for the storage and transportation of leadframes as defined in claim 10 wherein each said divider comprises a vertical section and a horizontal section along the top of said vertical section extending outwardly on both sides thereof, the horizontal section having a top surface which is flush with the top surfaces of the flanges of said first and second side walls when engaged therewith.

12. A thermoplastic tray for the storage and transportation of leadframes as defined in claim 11 wherein at least one notch is provided in said rectangular base in a vertical plane common to the slots in said first and second side walls; downwardly and outwardly hook-like projections are provided on said divider which extend through and engage with said base through said notch; and support ribs are provided on the underside of said rectangular base, which ribs are of a size sufficient to space the hook-like projection extending through the notch of said rectangular base from a supporting surface for the tray.

13. A thermoplastic tray for the storage and transportation of leadframes as defined in claim 10 wherein a plurality of drainholes are formed in said rectangular base to permit drainage of fluid therethrough, and spaced apertures are formed along at least one of said first and second hinge lines to provide more ready pivoting of said side walls relative to said rectangular base.

14. A thermoplastic tray for the storage and transportation of leadframes as defined in claim 10 wherein the flanged portion of said first side wall has at last two upwardly extending saddles thereon, the flanged portion of said second side wall has at last two upwardly extending saddles thereon, and said first and second side walls have pegs extending outwardly therefrom positioned thereon so as to mate with said upwardly extending saddles to enable stacking of a said tray atop another said tray.

* * * * *